United States Patent [19]

Kosaka

[11] Patent Number: 5,229,627
[45] Date of Patent: Jul. 20, 1993

[54] VERTICAL CAVITY TYPE VERTICAL TO SURFACE TRANSMISSION ELECTROPHOTONIC DEVICE

[75] Inventor: Hideo Kosaka, Tokyo, Japan

[73] Assignee: NEC Corporation, Tokyo, Japan

[21] Appl. No.: 747,561

[22] Filed: Aug. 20, 1991

[30] Foreign Application Priority Data

Aug. 20, 1990 [JP] Japan ................................. 2-218833

[51] Int. Cl.[5] .................. H01L 29/205; H01L 31/00; H01S 3/19
[52] U.S. Cl. ...................................... 257/85; 257/184; 257/436; 372/45; 372/99; 372/102
[58] Field of Search .................. 357/4, 16, 30, 19; 372/45, 99, 102

[56] References Cited

U.S. PATENT DOCUMENTS

| 4,819,048 | 4/1989 | Mand et al. ............................ 372/45 |
| 4,943,970 | 7/1990 | Bradley .................... 372/45 |
| 4,949,350 | 8/1990 | Jewell et al. . |
| 5,012,486 | 4/1991 | Luryi ...................... 372/45 |
| 5,028,969 | 7/1991 | Kasahara et al. ................... 357/19 |

OTHER PUBLICATIONS

K. Kasahara et al., "Double heterostructure optoelectronic switch as a dynamic memory with low—power consumption", Appl. Phys. Lett. 52(9), 29 Feb. 1988.

Ichiro Ogura et al., "Reconfigurable optical interconnection using a two-dimensional vertical to surface transmission electrophotonic device array", Appl. Phys. Lett. 57(6), 6 Aug. 1990.

T. Numai et al., "Surface-emitting laser operation in vertical-to-surface transmission electrophotonic devices with a vertical cavity", Appl. Phys. Lett 58(12), 25 Mar. 1991.

Y. Tashiro et al., "Vertical to surface transmission electrophotonic device with selectable output light channels", Appl. Phys. Lett 54(4), 23 Jan. 1989.

*Primary Examiner*—Jerome Jackson
*Attorney, Agent, or Firm*—Sughrue, Mion, Zinn, Macpeak & Seas

[57] ABSTRACT

A VC-VSTEP has a pnpn structure, and comprises first and second mirror structures, and an intermediate structure provided between the first and second mirror structures. The intermediate structure comprises an active and light absorption layer of multi-quantum well layers, and is set to have a thickness which is n times of an oscillation wavelength in a medium, where n is an integer.

3 Claims, 7 Drawing Sheets

5,229,627

VERTICAL CAVITY TYPE VERTICAL TO SURFACE TRANSMISSION ELECTROPHOTONIC DEVICE

FIELD OF THE INVENTION

This invention relates to a vertical cavity type vertical to surface transmission electrophotonic device (defined "VC-VSTEP" hereinafter), and more particularly, to a VC-VSTEP applicable to a high density parallel light transmission system, an optical information processing system, etc.

BACKGROUND OF THE INVENTION

A vertical to surface transmission electrophotonic device (defined "VSTEP" hereinafter) in which light is emitted from and received by the device in the vertical direction with respect to a semiconductor substrate is a key device which is indispensable for data transmission among computers and for optical computing therein.

A light emitting device type vertical to surface transmission electrophotonic device (defined "LED-VSTEP" hereinafter) is one of the conventional VSTEPs. In the LED-VSTEP, light emission of spontaneous emission mode occurs in the vertical direction with respect to a semiconductor substrate.

A laser diode type VSTEP of induced emission mode (defined "LD-VSTEP" hereinafter) has also been developed, and is another of the conventional VSTEPs. This LD-VSTEP comprises a cavity formed in the horizontal direction to a semiconductor substrate, and may comprise a reflecting mirror provided to have an angle of 45° relative to an active layer, so that light is emitted in the vertical direction to the substrate, as described on pages 329 to 331 of "Appl. Phys. Lett." Vol. 54, No. 4 January 1989.

However, the conventional LED-VSTEP has expected disadvantages in that the electrophotonic converting efficiency is not high, frequency response speed is not fast, and output light directivity is not good, because the light emission is of the spontaneous emission mode.

In addition, the conventional LD-VSTEP has disadvantages in that miniaturization is difficult, because a cavity is formed in the horizontal direction to the semiconductor substrate, and light absorption efficiency is low at the same wavelength as an oscillation wavelength, because an absorption layer and an active layer are provided separately from each other. There is a further disadvantage in the conventional LD-VSTEP in that photosensitivity is lowered when devices are connected in cascade.

SUMMARY OF THE INVENTION

Accordingly, it is an object of the invention to provide a VC-VSTEP from which light emission of induced emission mode occurs in the vertical direction to a semiconductor substrate without the necessity of a 45° reflecting mirror.

It is a further object of the invention to provide a VC-VSTEP having predetermined properties in electrophotonic converting efficiency, frequency response speed, and output light directivity.

It is a still further object of the invention to provide a VC-VSTEP which can be small in size.

It is a still further object of the invention to provide a VC-VSTEP having predetermined light absorption efficiency and photosensitivity.

According to the invention, a VC-VSTEP, comprises:
a pnpn structure;
a quantum well structure provided in the pnpn structure and functioning as a light absorption layer and an active layer;
first and second optical guide structures provided above and below the quantum well structure and being part of the pnpn structure; and
first and second multi-layered mirror structures provided above the first optical guide structure and below the second optical guide structure and being part of the pnpn structure;
wherein a total thickness of the quantum well structure and the first and second optical guide structures is set to be n times an oscillation wavelength in a medium, where n is an integer, and reflection factors of the first and second multilayered mirror structures are asymmetrical to provide a vertical cavity, whereby a light absorption factor is increased therein.

BRIEF DESCRIPTION OF THE DRAWINGS

The invention will be explained in more detail in conjunction with appended drawings, wherein.

DESCRIPTION OF THE PREFERRED EMBODIMENT

Before describing a VC-VSTEP according to the invention, the aforementioned conventional LED-VSTEP and LD-VSTEP will be explained in FIGS. 1 and 2.

Figure 1:
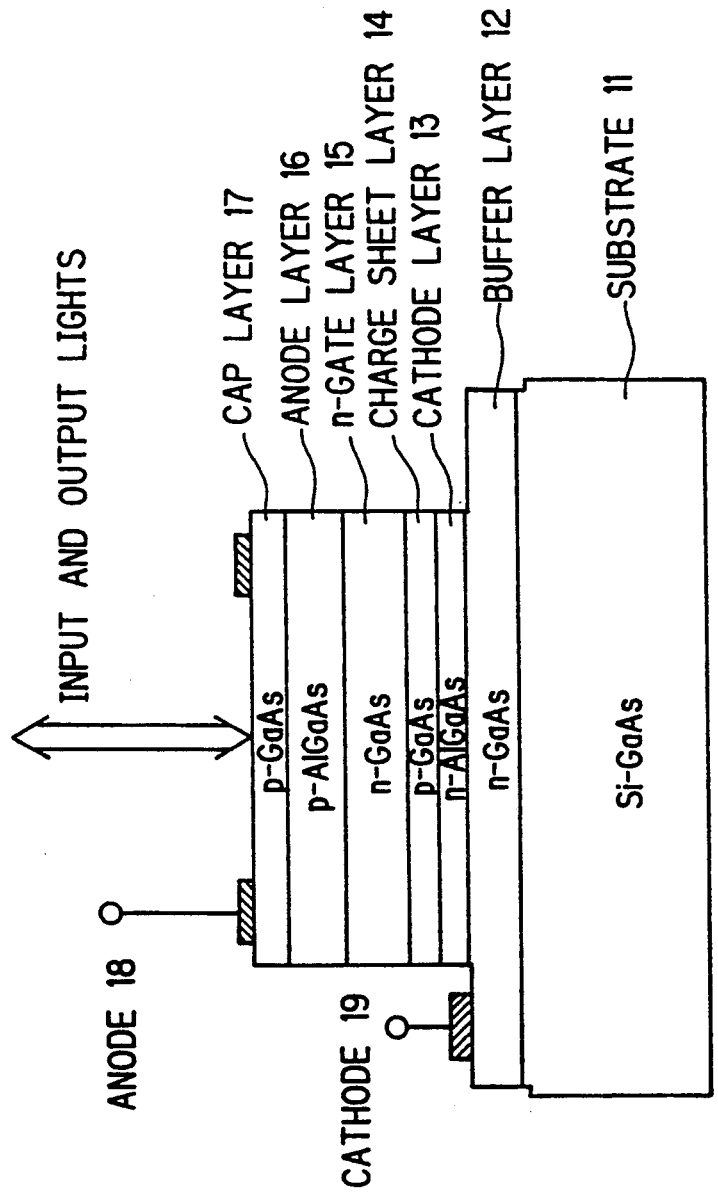
FIG. 1 is a schematic cross-sectional view showing a conventional LED-VSTEP.

FIG. 1 shows the conventional LED-VSTEP which comprises a semiconductor substrate 11 of Si-GaAs, a buffer layer 12 of n-GaAs, a cathode layer 13 of n-AlGaAs, a charge sheet layer 14 of p-GaAs, a gate layer 15 of n-GaAs, an anode layer 16 of p-AlGaAs, and a cap layer 17 of p-GaAs. The conventional LED-VSTEP further comprises an anode electrode 18 provided on the cap layer 27, and a cathode electrode 19 provided on the buffer layer 12.

In operation, a predetermined bias voltage is applied across the anode and cathode electrodes 18 and 19, so that output light of spontaneous emission mode is emitted in the vertical direction with respect to the substrate 11 from an aperture of the anode electrode 18, as shown by an arrow.

Figure 2:
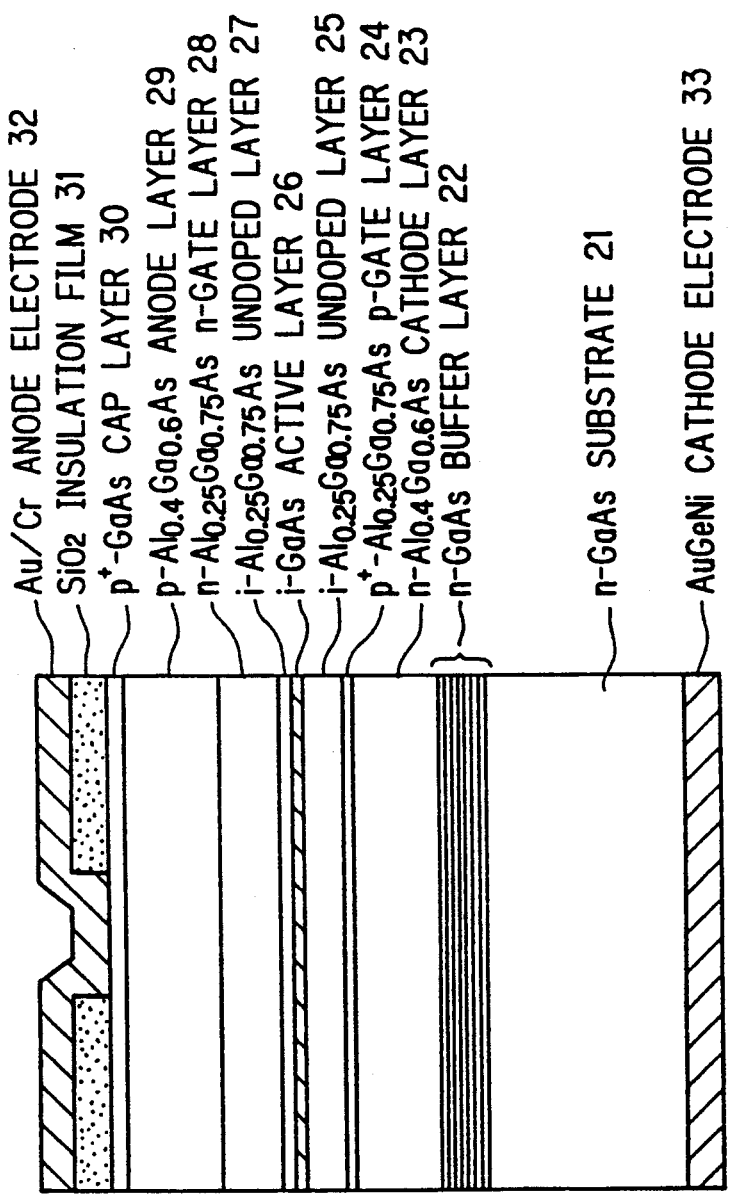
FIG. 2 is a schematic cross-sectional view showing a conventional LD-VSTEP.

FIG. 2 shows the conventional LD-VSTEP which comprises a semiconductor substrate 21 of n-GaAs, a buffer layer 22 of n-GaAs, a cathode layer 23 of n-Al$_{0.4}$Ga$_{0.6}$As, a p-gate layer 24 of p$^+$-Al$_{0.25}$Ga$_{0.75}$As, undoped layers 25 and 27 of i-Al$_{0.25}$Ga$_{0.75}$As, an active layer 26 of i-GaAs, an n-gate layer 28 of n-Al$_{0.25}$Ga$_{0.25}$As, Al$_{0.25}$Ga$_{0.25}$As, an anode layer of p-Al$_{0.4}$Ga$_{0.6}$As, a cap layer 30 of p$^+$-GaAs, and an insulation film layer 31 of SiO$_2$. The LD-VSTEP further comprises a p-electrode 32 of Au/Cr which is in partial contact with the cap layer 30, and an n-electrode 33 of AuGaNi which is provided on the back surface of the substrate 21.

Figure 3:
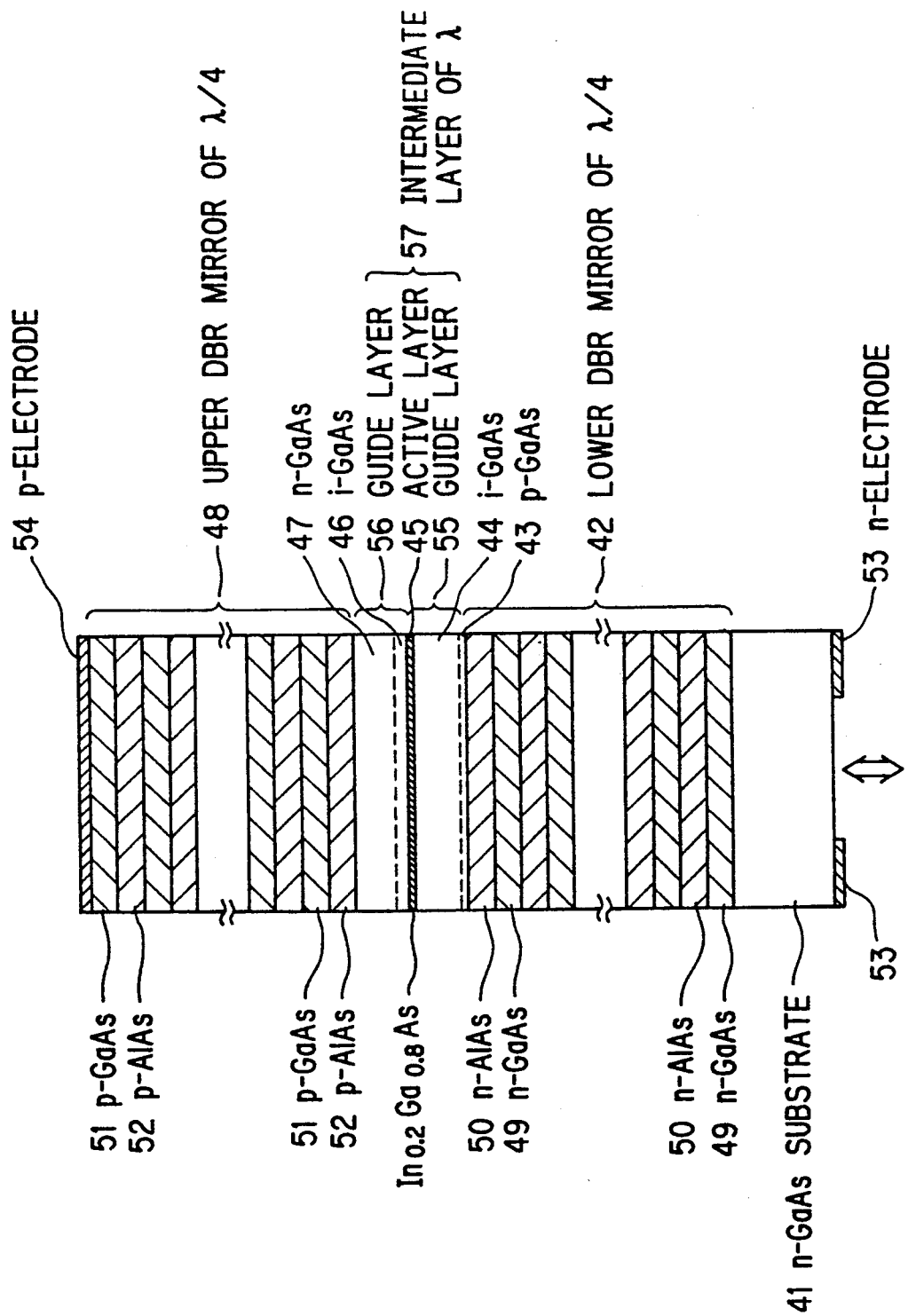
FIG. 3 is a schematic cross-sectional view showing a VC-VSTEP in a preferred embodiment according to the invention.

Next, a VC-VSTEP of a preferred embodiment according to the invention will be explained with reference to FIG. 3.

On a semiconductor substrate 41 of n-GaAs, a lower DBR mirror 42 having a doping concentration of $5 \times 10^{17}$cm$^{-3}$, a p-GaAs layer 43 having a doping concentration of $1 \times 10^{19}$cm$^{-3}$ and a thickness of 50 Å, an undoped Al$_{0.25}$Ga$_{0.75}$As having a thickness of less than 1500 Å, an undoped In$_{0.2}$Ga$_{0.8}$As layer 45 for an active layer including three quantum well layers each having a thickness of 100 Å (in detail, each quantum layer including a 100 Å well layer of In$_{0.2}$Ga$_{0.8}$As and a 100 Å A barrier layer of Al$_{0.25}$Ga$_{0.75}$As), an undoped Al$_{0.25}$Ga$_{0.75}$As layer 46 having a thickness of less than 500 Å, an n-GaAs layer 47 having a doping concentration of $3 \times 10^{17}$cm$^{-3}$ and a thickness of less than 1000 Å, and an upper DBR mirror 48 having a doping concentration of $5 \times 10^{18}$cm$^{-3}$ are successively grown by the molecular beam epitaxial method. The lower DBR mirror 42 is composed of 14.5 pairs of n-GaAs layers 49 each having a thickness of approximately 672 Å and n-AlAs layers 50 each having a thickness of approximately 804 Å which are grown alternately, and the upper DBR mirror 48 is composed of 15 pairs of p-GaAs layers 51 each having a thickness of approximately 672 Å and p-AlAs layers 52 each having a thickness of approximately 804 Å which are grown alternately. In addition, there are provided an n-electrode 53 on the back surface of the substrate 41, and a p-electrode 54 on the upper DBR mirror 48.

In the VC-VSTEP, the p-GaAs layer 43 and the i-GaAs layer 44, and the i-GaAs layer 46 and the n-GaAs layer 47 provide optical guide layers 55 and 56, respectively, and the optical guide layers 55 and 56 and the active layer 45 provide an intermediate layer 57. A thickness of the intermediate layer 57 is set in this preferred embodiment to be n times a wavelength of laser oscillation in the medium, where n is an integer. Here, the wavelength is approximately 0.3 μm, assuming that a cavity wavelength is 9500 Å.

In principle, a VSTEP is a light emitting and receiving device having functions of threshold processing and memory by including a pnpn structure. In the VC-VSTEP, the quantum well layers 45 function as an active layer at the time the device is ON, and function as an absorption layer at the time the device is OFF, and it is expected that the effect of absorption is increased, and an absorption wavelength band and an oscillation wavelength become equal, if the vertical cavity is made asymmmetrical therein.

As described above, the active layer 45 which is for the absorption layer at the time of OFF has a thickness of only 300 Å. Ordinarily, a light absorption factor which is obtained in an absorption layer of such a thin thickness is no more than approximately 3%, even if an absorption coefficient is estimated to be 10000 cm$^{-1}$ which is considered to oe the largest value. In the invention, however, the light absorptivity becomes much greater in accordance with the effect of multi-reflection caused by the multi-reflection layers of the lower and upper DBR mirrors 42 and 48 (cavity effect).

In the invention, a thickness of the intermediate layer 57 including the active layer 45 is set to be n times a resonant wavelength in the medium, so that lights reflected in the lower and upper DBR mirrors 42 and 48 are out of phase. Accordingly, light having a wavelength which just resonates with the cavity is reflected with the largest intensity by the lower and upper DBR mirrors 42 and 48, so that the reflected lights are cancelled due to their being "out of phase". In the invention, the asymmetrical cavity structure is optimized to provide the lower and upper DBR mirrors 42 and 48 with reflection factors which are based on the consideration of an absorption coefficient of the active layer 45, so that reflection and transmission of light can be almost negligible, and the absorption factor can be large.

Figure 4:
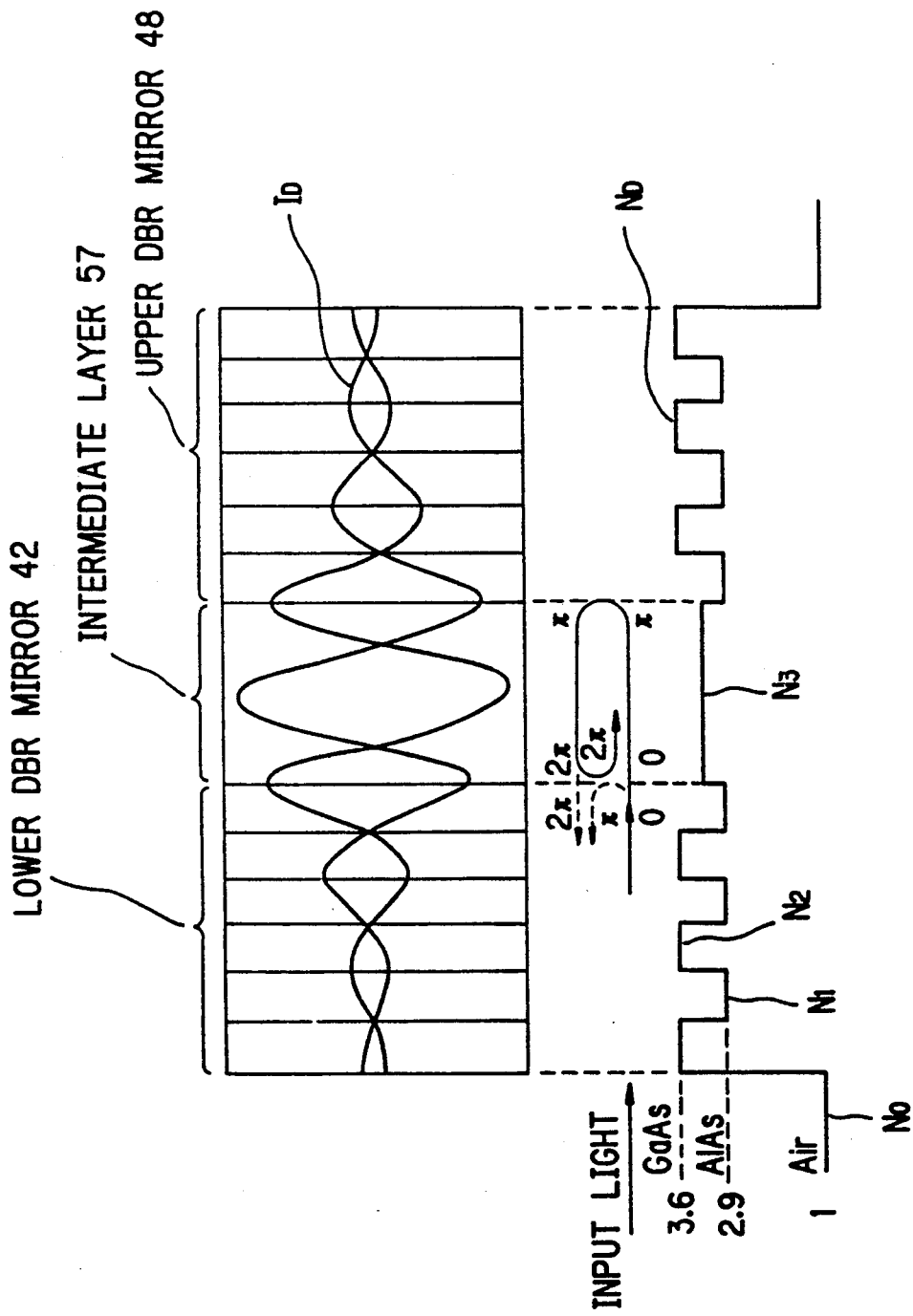
FIG. 4 is an explanatory diagram explaining the increase of light absorption in the VC-VSTEP.

FIG. 4 shows a light intensity distribution ID in the intermediate layer 57 and the lower and upper DBR mirrors 42 and 48, and a refractive index distribution $N_D$ therein. As clearly shown therein, the refractive index distribution $N_D$ is defined by refractive indices $N_1$ (=2.9) of the AlAs layers and $N_2$ (=3.6) of the GaAs layers for the lower and upper DBR mirrors 42 and 48, and a refractive index $N_3$ for the intermediate layer 57 which is higher than the refractive index $N_1$ and lower than the refractive index $N_2$, in addition to a refractive index $N_0$ of air shown to be "1" therein. For this refractive index distribution $N_D$, an input light is transmitted through the lower DBR mirror 42 and the intermediate layer 57, and reflected at an interface between the intermediate layer 57 and the upper DBR mirror 48 and at an interface between the intermediate layer 57 and the lower DBR mirror 42, repeatedly, as shown by an arrow. In this light reflection, a phase difference of x occurs between the two interfaces. As described before, the number of the lower and upper DBR mirrors 42 and 48 is optimized, so that the increase of light intensity occurs in the intermediate layer 57 to provide an absorption factor which is as high as 99.92%, despite the structure in which the absorption layer (the active layer 45) is as thin as 300 Å. Thus, the light intensity distribution $I_D$ is obtained as shown therein.

Ordinarily, a wavelength of laser oscillation is lower than an absorption band, and an absorption coefficient of the absorption layer (an active layer) becomes low at the oscillation wavelength. In the invention, however, laser light is effectively absorbed, because a reverse bias voltage is applied to the absorption layer (the active layer 45) at the time the device is OFF to result in the confinement of quantum, so that an absorption band is shifted in the direction of long wavelength by the optical Stark effect.

In operation, when a bias voltage is applied across the n- and p-electrodes 53 and 54, the input and output of light is carried out through the n-GaAs substrate 41.

Figure 5B:
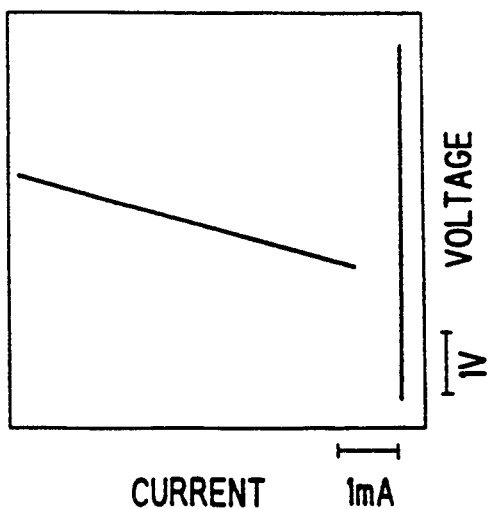
FIG. 5 is a graph explaining a property of light output relative to current and current relative to voltage in the VC-VSTEP.
Figure 5A:
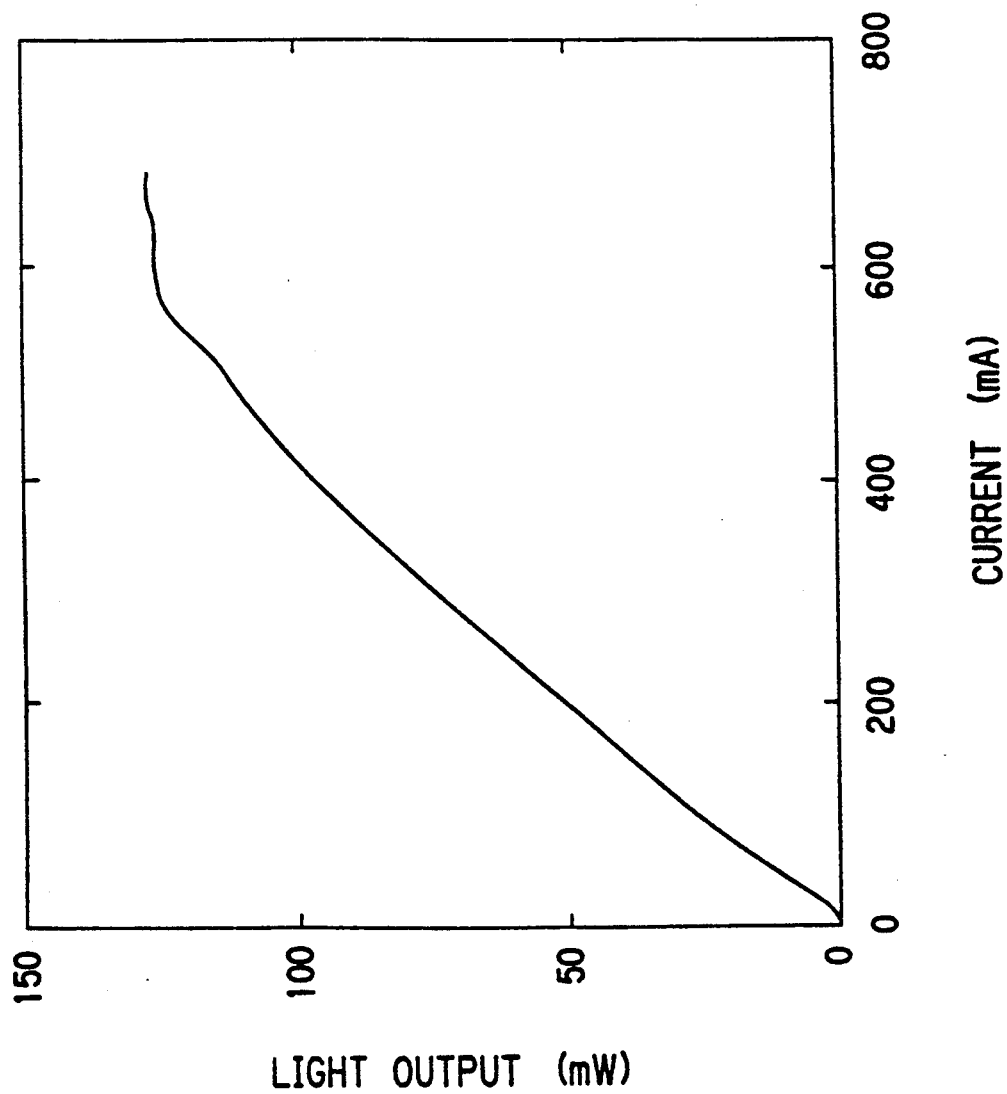

FIG. 5 shows a light output relative to a current flowing through the VC-VSTEP (FIG. 3) which has a size of 20×20 μm$^2$ and is turned on at room temperature by a pulse having a width of 20 ns, a repetition rate of 50 kHz and a duty ratio of 1/1000, and a current relative to a voltage in the form of the pulse applied to the VC-VSTEP under the same state. As shown therein, the maximum light output is 127 mW. In addition, a switching voltage for turning the VC-VSTEP on is 6 V, and a holding voltage for holding the ON state of the VC-VSTEP is 2 V. These voltage values are consistent with design goals.

Figure 6:
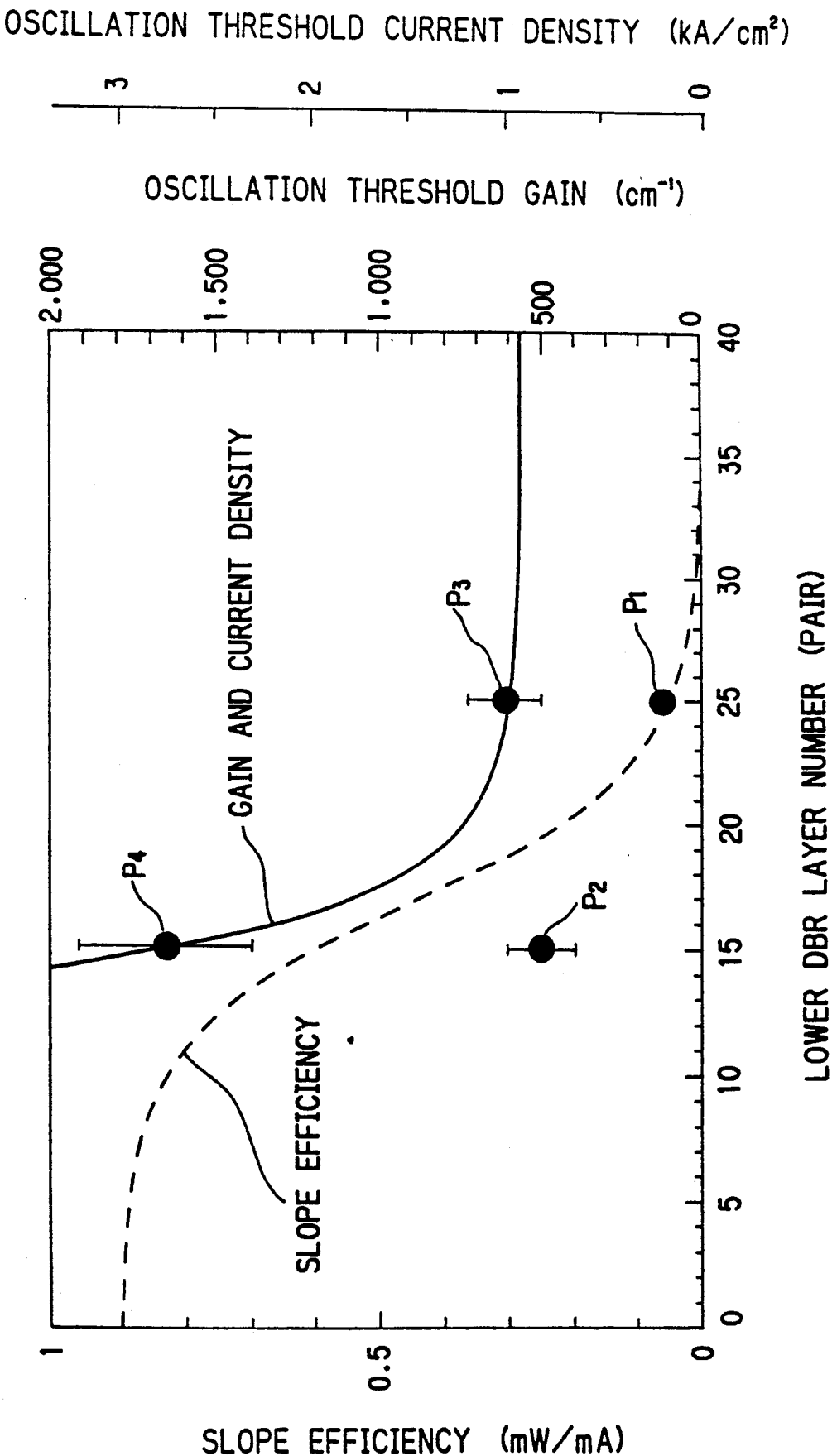
FIG. 6 is a graph explaining slope efficiency and oscillation threshold gain and current density relative to the number of lower DBR mirror layers.

FIG. 6 shows a slope efficiency and oscillation threshold gain and current density relative to the number of layers in the lower DBR mirror 42 of the VC-VSTEP, wherein the slope efficiency and the oscillation threshold gain and current density are measured in the VC-VSTEP having the upper DBR mirror of 15 pairs and the p-electrode of Au as shown by points $P_1$ to $P_4$, when the number is 14.5 pairs (the preferred embodiment) and 24.5 pairs, respectively. As clearly shown therein, the slope efficiency is improved from 0.06 mW/mA at 24.5 pairs to 0.32 mW/mA at 14.5 pairs, i.e., an improvement by a factor of 5, as shown by the points $P_1$ and $P_2$. Similarly, the oscillation threshold gain and current density are also improved by approximately a factor of 3, as shown by the points $P_3$ and $P_4$. At the same time, a solid curve and a dotted curve which are obtained by calculation are also shown to indicate the improvement of the oscillation threshold gain and current density and the slope efficiency. For the oscillation threshold gain and current density, the experimental and calculated results coincide. For the slope efficiency, however, the experimental result indicated by the point $P_2$ is lower than the calculation result indicated by the dotted curve, because a reflection factor of a p-electrode of Au-Zn is lower than that of a p-electrode of Au, and the dispersion loss in the lower and upper DBR mirrors was not considered.

Figure 7:
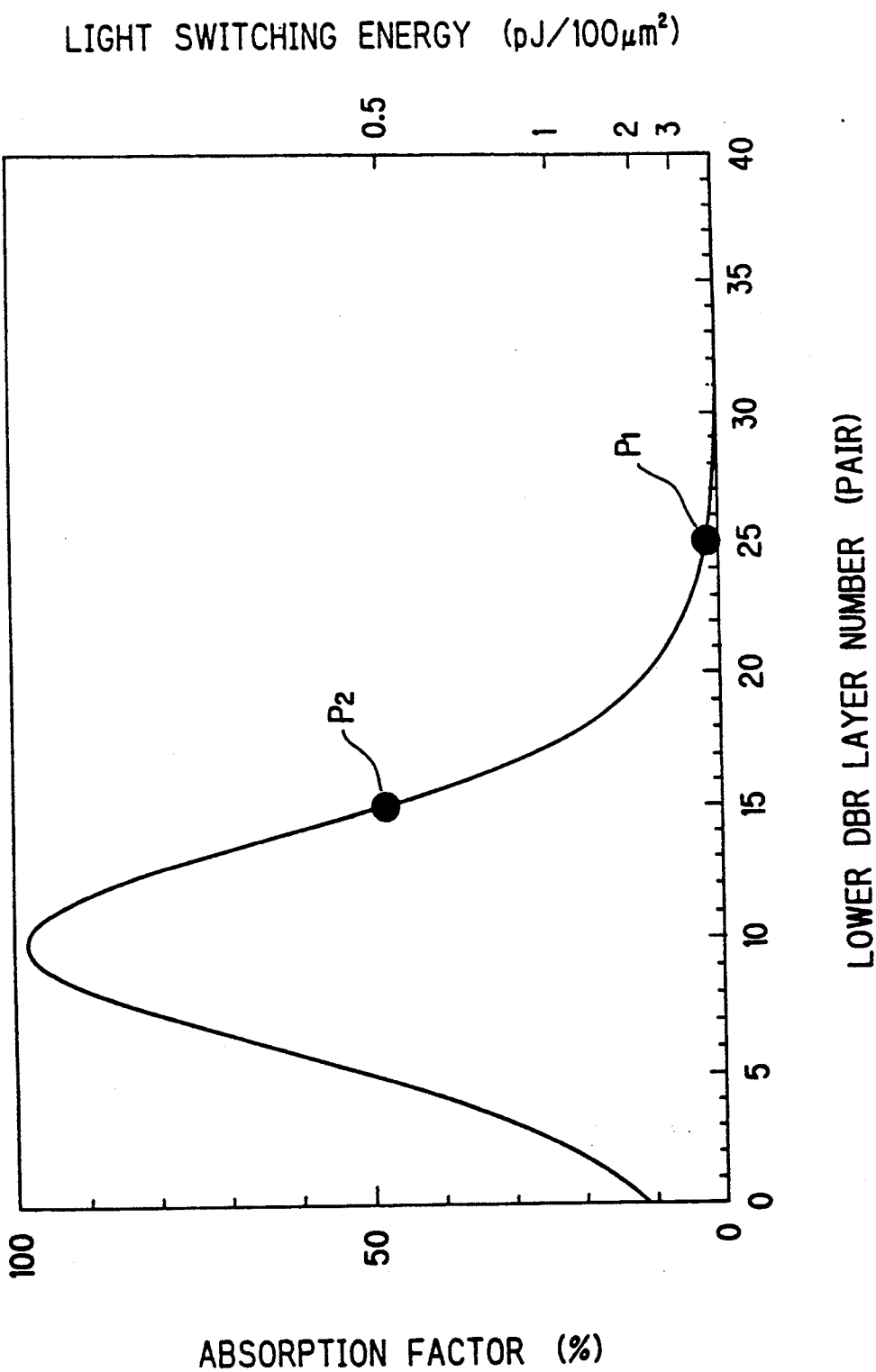
FIG. 7 is a graph explaining light absorption factor and light switching energy relative to the number of lower DBR mirror layers.

FIG. 7 shows an absorption factor and an optical switching energy relative to the number of layers in the lower DBR mirror 42 of the same VC-VSTEP as that used in FIG. 6, in which an absorption coefficient of the active layer 45 is 3000 cm$^{-1}$, wherein points $P_1$ and $P_2$, indicate experimental results, while a solid curve indicates a calculation result. The optical switching energy is improved from 14 pJ at 25 pairs to 0.5 pJ at 15 pairs, i.e., an improvement by a factor of 30, when the VC-VSTEP is converted to a VC-VSTEP having a size of $10 \times 10$ $\mu m^2$ and a switching speed of 10 ns. This improved value is consistent with design goals, and it is considered that this result is based on the increase of light absorption by the asymmetrical cavity.

Although the invention has been described with respect to specific embodiment for complete and clear disclosure, the appended claims are not to be thus limited but are to be construed as embodying all modifications and alternative constructions that may occur to one skilled in the art which fairly fall within the basic teaching herein set forth.

What is claimed is:

1. A vertical cavity type vertical to surface transmission electrophotonic device, comprising:
    a pnpn structure;
    a quantum well structure provided in said pnpn structure and functioning as a light absorption layer and an active layer;
    first and second optical guide structures provided above and below said quantum well structure and being part of said pnpn structure; and
    first and second multi-layered mirror structures provided above said first optical guide structure and below said second optical guide structure and being part of said pnpn structure;
    wherein a total optical thickness of said quantum well structure and said first and second optical guide structures is set to be n times an oscillation wavelength, where n is an integer, and said first and second multilayered mirror structures having asymmetrical reflectivities to provide a vertical cavity, whereby a light absorption factor is increased therein.

2. A vertical cavity type vertical to surface transmission electrophotonic device, according to claim 1, wherein:
    said quantum well structure comprises a plurality of quantum well layers;
    said first optical guide structure comprises p- and i-layers, and said second optical guide structure comprises i- and n-layers; and
    said first multi-layered mirror structure comprises a plurality of n-layers having two refractive indices, alternately, provided, and said second multi-layered mirror structure comprises a plurality of p-layers having said two refractive indices, alternately, provided.

3. A vertical cavity type vertical to surface transmission electrophotonic device, comprising:
    a semiconductor substrate of a first conductivity type;
    a lower DBR mirror provided on a first surface of said semiconductor substrate, and including a plurality of a first conductivity type layers having first and second refractive indices alternately provided;
    a lower optical guide layer provided on a first surface of said lower DBR mirror, and including a second conductivity type layer and an intrinsic type layer;
    an active layer provided on a first surface of said lower optical guide layer, and including a plurality of quantum well layers;
    an upper optical guide layer provided on a first surface of said active layer, and including an intrinsic type layer and a first conductivity type layer;
    an upper DBR mirror provided on a first surface of said upper optical guide layer, and including a plurality of a second conductivity type layers having said first and second refractive indices alternately provided;
    a first electrode provided on a first surface of said upper DBR mirror; and
    a second electrode provided on a second surface of said semiconductor substrate, and having an aperture for input and output of light.

* * * * *